US009577102B1

(12) United States Patent
Hsiao et al.

(10) Patent No.: US 9,577,102 B1
(45) Date of Patent: Feb. 21, 2017

(54) METHOD OF FORMING GATE AND FINFET (71) Applicant: TAIWAN SEMICONDUCTOR MANUFACTURING CO., LTD., Hsinchu (TW)

(72) Inventors: Yu-Ting Hsiao, Tainan (TW); Cheng-Ta Wu, Chiayi County (TW); Lun-Kuang Tan, Hsinchu (TW); Liang-Yu Yen, Tainan (TW); Ting-Chun Wang, Tainan (TW); Tsung-Han Wu, Tainan (TW); Wei-Ming You, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/865,663

(22) Filed: Sep. 25, 2015

(51) Int. Cl.
H01L 21/28 (2006.01)
H01L 29/78 (2006.01)
H01L 29/66 (2006.01)
H01L 21/3215 (2006.01)
H01L 29/06 (2006.01)

(52) U.S. Cl.
CPC ....... *H01L 29/7851* (2013.01); *H01L 21/3215* (2013.01); *H01L 29/0649* (2013.01); *H01L 29/66545* (2013.01); *H01L 29/66795* (2013.01)

(58) Field of Classification Search
CPC ................................. H01L 29/66545
USPC .......................................... 438/299
See application file for complete search history.

(56) References Cited

U.S. PATENT DOCUMENTS

| 8,546,209 B1* | 10/2013 | Cheng ................. H01L 29/6659 257/E21.434 |
| 9,331,079 B2* | 5/2016 | Han ..................... H01L 27/0924 |
| 2010/0330790 A1* | 12/2010 | Hempel ............ H01L 21/31055 438/585 |
| 2011/0073956 A1* | 3/2011 | Heinrich ............ H01L 27/0629 257/379 |
| 2012/0032238 A1* | 2/2012 | Teo .................... H01L 21/28518 257/288 |
| 2012/0248550 A1* | 10/2012 | Huang ................. H01L 27/088 257/410 |
| 2014/0015104 A1* | 1/2014 | Su .......................... H01L 21/225 257/611 |
| 2014/0151760 A1* | 6/2014 | Wang ................ H01L 21/76825 257/288 |
| 2015/0145066 A1* | 5/2015 | Lu ..................... H01L 29/66795 257/401 |
| 2015/0187939 A1* | 7/2015 | Wu ................... H01L 29/66545 257/412 |
| 2015/0206949 A1* | 7/2015 | Zhao .................... H01L 29/495 257/410 |
| 2015/0270399 A1* | 9/2015 | Zhu ................... H01L 21/26506 257/347 |
| 2015/0340365 A1* | 11/2015 | Han .................. H01L 21/32134 257/369 |

(Continued)

*Primary Examiner* — George Fourson, III
(74) *Attorney, Agent, or Firm* — Maschoff Brennan (57) ABSTRACT

A method of forming a gate includes: forming a dummy gate; forming an inter layer dielectric (ILD) laterally adjacent to the dummy gate; doping a dopant into the dummy gate and the ILD, in which a surface dopant concentration of the dummy gate is lower than a surface dopant concentration of the ILD; removing the dummy gate to form a cavity after doping the dopant into the dummy gate and the ILD; and forming the gate in the cavity.

19 Claims, 4 Drawing Sheets

(56) References Cited

U.S. PATENT DOCUMENTS

2015/0364573 A1* 12/2015 Yeh .................. H01L 29/66545
438/595
2016/0079389 A1* 3/2016 Wu .................. H01L 29/66537
438/289

* cited by examiner

METHOD OF FORMING GATE AND FINFET

BACKGROUND

The semiconductor integrated circuit (IC) industry has experienced rapid growth. Over the course of the growth, functional density of the semiconductor devices has increased with decrease of device feature size or geometry. The scaling down process generally provides benefits by increasing production efficiency, reducing costs, and/or improving device performance. However, such scaling down has also increased complexity of the IC manufacturing processes.

With the demands on shrinking geometry of ICs, a three dimensional transistor, such as a fin-like field-effect transistor (FinFET), has been introduced to replace a planar transistor. However, device performance and yield of such FinFET are still not satisfactory in advanced applications of technology. Therefore, improvements in structures and methods of forming a FinFET with better device performance continue to be sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As mentioned above, device performance and yield of such FinFET are still not satisfactory in advanced applications of technology. For example, a small top critical dimension (CD) of a dummy gate is a yield killer for the current FinFET. Specifically, after a real gate replaces the dummy gate, a portion of the real gate is removed to form an opening, and a protective layer is then formed in the opening and over the gate to protect the gate during subsequent formation of holes. The holes are configured to respectively accommodate contact plugs for electrically connecting to source and drain regions. However, the small top CD of the dummy gate will result in a small top CD of the real gate. It is difficult to remove enough thick portion of the gate due to process limit of the small CD. Therefore, the formed protective layer may be too thin and thus fails to protect the gate during subsequent formation of holes, resulting in low device performance and yield of the current FinFET.

Accordingly, the present disclosure provides a method of forming a gate with a large top CD compared to the gate of the current FinFET by controlling dopant concentration during doping a dopant into a dummy gate and an inter layer dielectric (ILD) to obtain a suitable contour of the dummy gate. The suitable contour of the dummy gate is conducive to carry out follow-up processes, and thus to improve device performance and yield of the current FinFET. Embodiments of the method of forming the gate with the large top CD and the FinFET including the gate therewith will be described below in detail.

Figure 1:
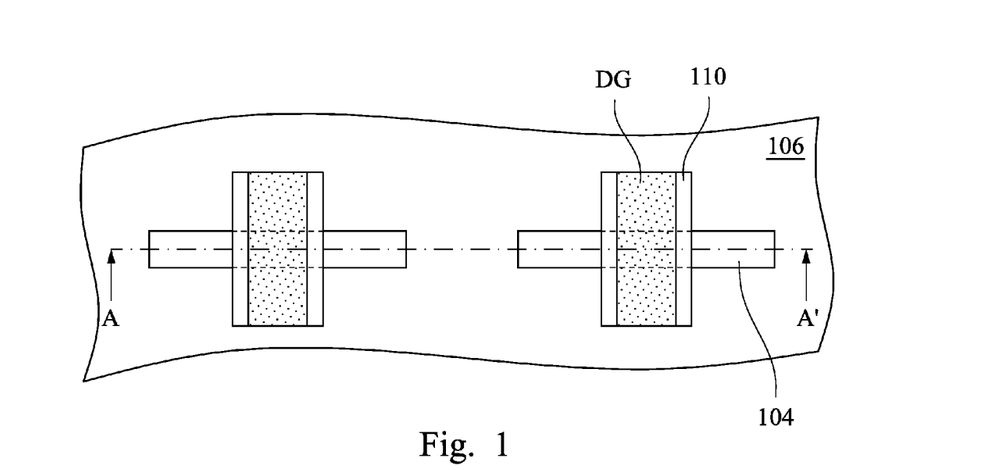
FIG. 1 is a simplified top view of a fin structure and a dummy gate in accordance with some embodiments of the present disclosure.

The present disclosure provides a method of forming the gate with the large top CD. FIG. 1 is a simplified top view of a fin structure 104 and a dummy gate DG in accordance with some embodiments of the present disclosure. FIGS. 2A to 2I are cross-sectional views at various stages of forming a gate G taken along a section line AA' of FIG. 1 in accordance with some embodiments of the present disclosure.

A substrate (not shown) is firstly provided. In some embodiments, the substrate includes an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or a combination thereof. In some embodiments, the substrate is a bulk silicon substrate.

Figure 2A:
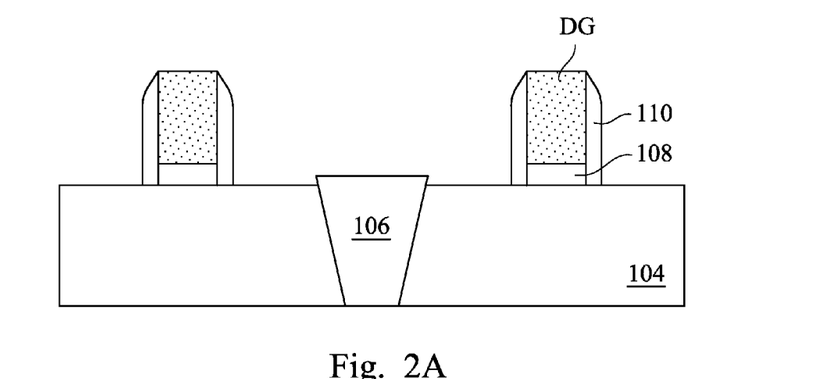
FIGS. 2A to 2I are cross-sectional views at various stages of forming a gate taken along a section line AA' of FIG. 1 in accordance with some embodiments of the present disclosure.

In some embodiments, as shown in FIGS. 1 and 2A, the fin structure 104 is formed by selectively etching the substrate mentioned above. Specifically, in the embodiments, portions of the substrate are removed to define the fin structure 104 protruding from the substrate. In some embodiments, the substrate and the fin structure 104 are integrally formed; that is, there is no boundary between the substrate and the fin structure 104. However, other techniques for fabricating the fin structure 104 are possible. In some embodiments, the substrate and the fin structure 104 are made of a same material.

In some embodiments, as shown in FIGS. 1 and 2A, an isolation structure 106 is formed between the fin structures 104, such as a shallow trench isolation (STI) structure. The isolation structure 106 is configured to isolate the two fin structures 104. In some embodiments, the isolation structure 106 is made of a dielectric material, such as silicon oxide, silicon nitride, silicon oxynitride, fluoride-doped silicate glass, a low-k dielectric material, any other suitable dielectric material or a combination thereof.

A dielectric layer 108 and a dummy gate DG are then formed crossing over the fin structure 104, as shown in FIGS. 1 and 2A. The dummy gate DG will be removed later to form a cavity, and a conductive material will then be formed in the cavity to form a real gate. In some embodiments, a dielectric material (not shown) is formed over the fin structure 104 using sputtering, physical vapor deposition (PVD), chemical vapor deposition (CVD), metal organic chemical vapor deposition (MOCVD), molecular beam epitaxy (MBE), any other method known and used in the art for forming the dielectric material or a combination thereof. In some embodiments, the dielectric material is made of silicon oxide, silicon nitride, silicon oxynitride, silicon carbon nitride, any other suitable dielectric material or a combination thereof. In some embodiments, after the dielectric material is formed, a dummy gate material (not shown) is then formed over the dielectric material by deposition, such as PVD or CVD. In some embodiments, the dummy gate material is made of polysilicon, amorphous silicon, any other suitable material or a combination thereof. In some embodiments, a patterning process, such as photolithography and etching processes, is performed on the dummy gate material and the dielectric material therebeneath to form the dummy gate DG and the dielectric layer 108 crossing over the fin structure 104.

Still referring to FIGS. 1 and 2A, a spacer 110 is formed laterally adjacent to the dummy gate DG after forming the dummy gate DG. In some embodiments, a dielectric material (not shown) is deposited covering the dummy gate DG and then etched to form the spacer 110 over sidewalls of the dummy gate DG. In some embodiments, the spacer 110 is made of silicon oxide, silicon nitride, silicon oxynitride, silicon carbon nitride, any other suitable dielectric material or a combination thereof.

Figure 2B:
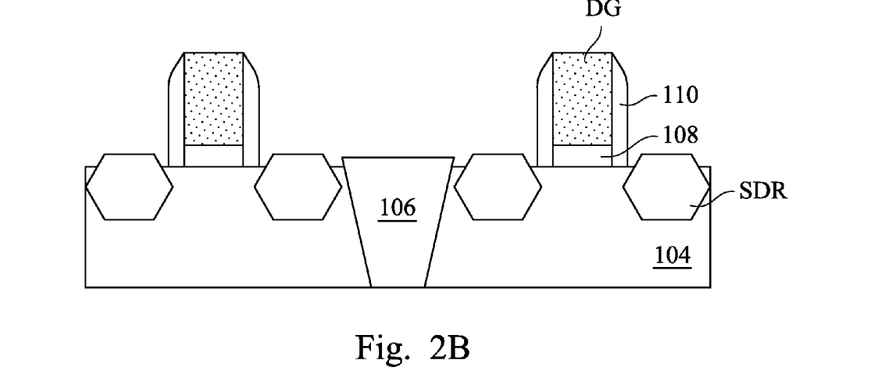

Referring to FIG. 2B, a source-drain region SDR is formed in the fin structure 104. Specifically, after the spacer 110 is formed, portions of the fin structure 104 are removed to form recesses, and the source-drain regions SDRs are then respectively formed in the recesses. In some embodiments, the portions of the fin structure 104 are removed using photolithography and etching processes, which may include: forming a photoresist layer, patterning the photoresist layer to expose the portions of the fin structure 104 and etching the portions of the fin structure 104 according to the photoresist layer. In some embodiments, the source-drain regions SDRs are respectively epitaxially (epi) grown in the recesses. In some embodiments, each of the source-drain region SDRs is epitaxially grown protruding from the recess and has an upper surface higher than an upper surface of the fin structure 104.

Figure 2C:
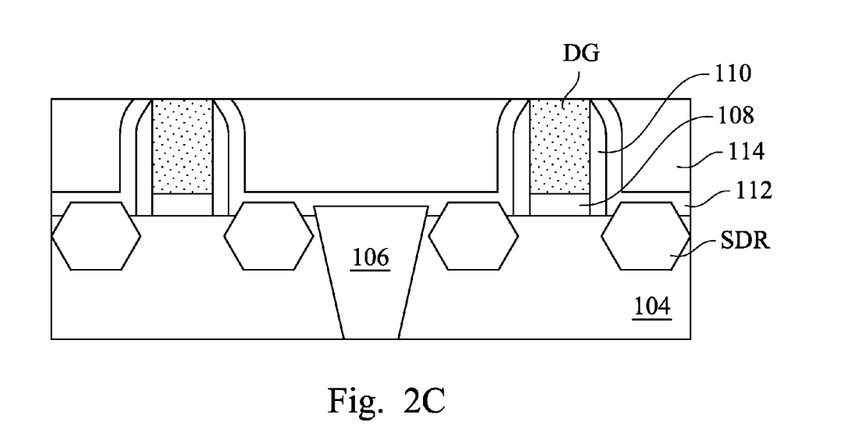

Referring to FIG. 2C, after the source-drain region SDR is formed, a contact etch stop layer (CESL) 112 is formed over the source-drain region SDRs and laterally adjacent to the dummy gate DG. After the CESL 112 is formed, an ILD 114 is formed over the CESL 112 and laterally adjacent to the dummy gate DG. In some embodiments, the CESL 112 is formed using sputtering, PVD, CVD, MOCVD or MBE. However, other methods for fabricating the CESL 112 may alternatively be used. In some embodiments, the CESL 112 is made of silicon nitride, silicon oxynitride, silicon carbon nitride, any other suitable insulating material or a combination thereof. In some embodiments, the ILD 114 is formed using sputtering, PVD, CVD, MOCVD, MBE, other methods known and used in the art for forming the ILD 114 or a combination thereof. In some embodiments, the ILD 114 is made of silicon oxide, silicon oxynitride, any other suitable insulating material or a combination thereof.

In some embodiments, after the CESL 112 and the ILD 114 are sequentially formed, a planarization process is performed to form the structure of FIG. 2C. In some embodiments, after the planarization process is performed, the dummy gate DG has an upper surface coplanar with an upper surface of the CESL 112 and an upper surface of the ILD 114. In some embodiments, the planarization process includes a chemical mechanical polishing (CMP) process, a grinding process, an etching process or another suitable material removal process.

Figure 2D:
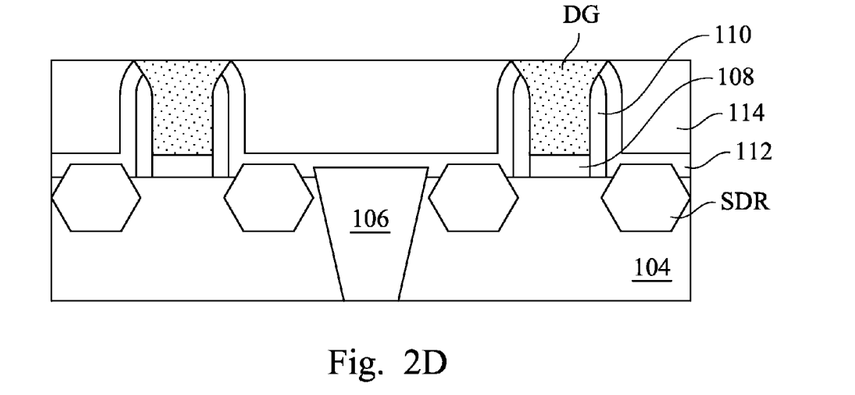

Referring to FIGS. 2C and 2D, a first annealing process is performed after forming the ILD 114 laterally adjacent to the dummy gate DG. In some embodiments, performing the first annealing process includes performing the first annealing process on the ILD 114 to broaden an upper width of the dummy gate DG, as shown in FIG. 2D. It is because the ILD 114 is shrunk during the first annealing process to provide tensile stress to the dummy gate DG, and thus the upper width of the dummy gate DG becomes broader. In some embodiments, the dummy gate DG has an upper width greater than a lower width of the dummy gate DG, as shown in FIG. 2D. The "upper width" and the "lower width" used herein respectively refer to a width away from the fin structure 104 and a width near the fin structure 104 by comparison. In some embodiments, the dummy gate DG has no upper widths smaller than a lower width of the dummy gate DG. In some embodiments, the first annealing process is performed at 300 to 800° C. In some embodiments, the first annealing process is performed at 400 to 700° C. In some embodiments, the first annealing process is performed for 1 hr to 6 hrs. In some embodiments, the first annealing process is performed with water vapor. In some embodiments, the first annealing process is performed with nitrogen.

Figure 2E:
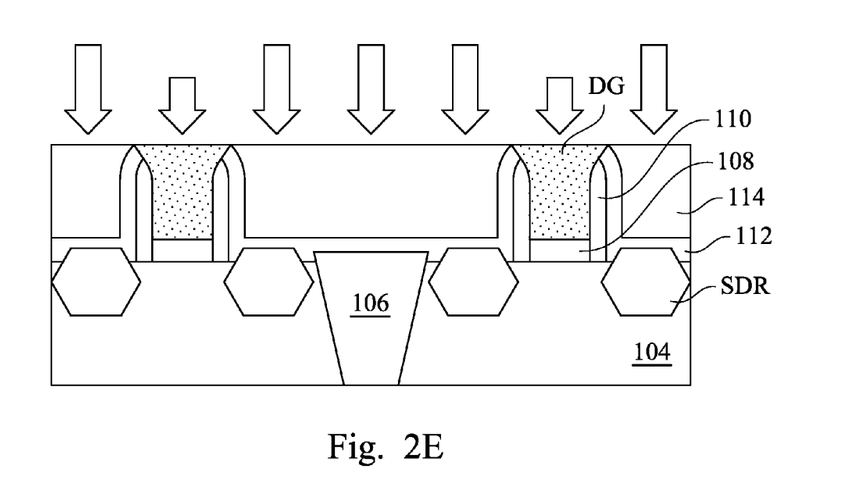

Referring to FIG. 2E, after the first annealing process is performed, a doping process is performed. In the doping process, a dopant (not shown) is doped into the dummy gate DG and the ILD 114, in which a surface dopant concentration of the dummy gate DG is lower than a surface dopant concentration of the ILD 114. In some embodiments, the surface dopant concentration of the dummy gate DG is $10^{13}$ ions/cm$^3$ to $10^{16}$ ions/cm$^3$. In some embodiments, the surface dopant concentration of the dummy gate DG is zero. In some embodiments, the surface dopant concentration of the ILD 114 is $10^{14}$ ions/cm$^3$ to $10^{17}$ ions/cm$^3$. In some embodiments, the surface dopant concentration of the ILD 114 is at least ten times more than the surface dopant concentration of the dummy gate DG. In some embodiments, the dopant is selected from the group consisting of IVA group elements (such as carbon (C), silicon (Si), germanium (Ge), tin (Sn) or lead (Pb)), VIIIA group elements (such as helium (He), neon (Ne), argon (Ar), krypton (Kr), xenon (Xe) or radon (Rn)) and a combination thereof.

Still referring to FIG. 2E, after the doping process is performed, a second annealing process is performed to drive the dopant toward the fin structure 104 to provide compressive stress to a channel region (i.e., a portion of the fin structure 104 overlapped with the dummy gate DG). The compressive stress will affect effective width of the channel region, and thus to improve device performance and yield of the finally formed FinFET. In some embodiments, the second annealing process is performed at 500 to 1,300° C. In some embodiments, the second annealing process is performed at 700 to 1,200° C. In some embodiments, the second annealing process is performed for less than or equal to 1 sec.

In another aspect, during the second annealing process, the dopant may also provide compressive stress to the dummy gate DG to narrow the width of the dummy gate DG. Therefore, during the doping process, the surface dopant concentration of the dummy gate DG is lower than the surface dopant concentration of the ILD 114 to provide less compressive stress to the dummy gate DG, and thus the contour of the dummy gate DG is not significantly changed before and after the second annealing process is performed.

In some embodiments, during the doping process, a surface dopant concentration of the ILD 114 adjacent to the dummy gate DG is lower than a surface dopant concentration of the ILD 114 away from the dummy gate DG to further reduce compressive stress to the dummy gate DG. In some embodiments, during the doping process, a surface dopant concentration of the spacer 110 is lower than a surface dopant concentration of the ILD 114 adjacent to the dummy gate DG. In some embodiments, during the doping process, a surface dopant concentration of the CESL 112 is lower than a surface dopant concentration of the ILD 114 adjacent to the dummy gate DG. In some embodiments, a surface dopant concentration of the spacer 110 is lower than or equal to a surface dopant concentration of the CESL 112. In some embodiments, the surface dopant concentration is gradually or step-wise decreased from the ILD 114 away from the dummy gate DG toward the dummy gate DG and can be appropriately adjusted to obtain an optimized contour of the dummy gate DG.

Figure 2F:
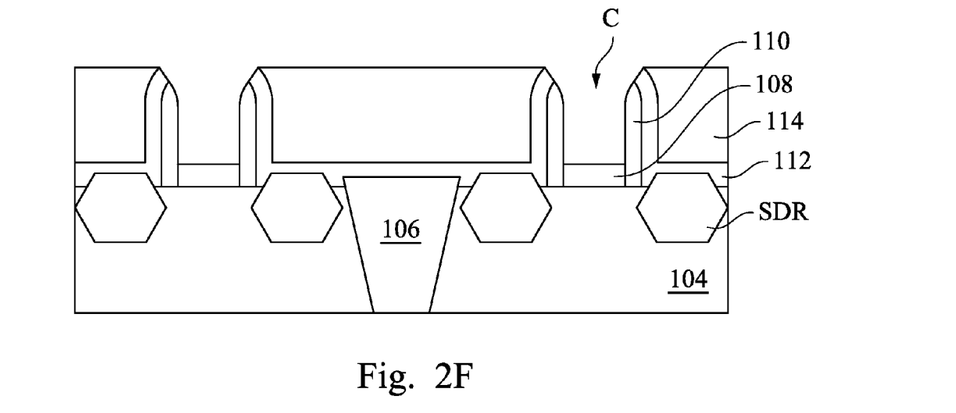

Referring to FIGS. 2E and 2F, after the second annealing process is performed, the dummy gate DG is removed to form a cavity C confined by the spacer 110. In some embodiments, the dummy gate DG is removed using an etching process, such as dry, wet etching process or a combination thereof. In some embodiments, the dummy gate DG is removed using hydrofluoric acid, sulfuric acid, ozone, any other suitable chemical or a combination thereof. In some embodiments, the formed cavity C has no upper widths smaller than a lower width of the cavity C. In some embodiments, the formed cavity C has no neck portion. In some embodiments, the cavity C has large top CD.

Figure 2G:
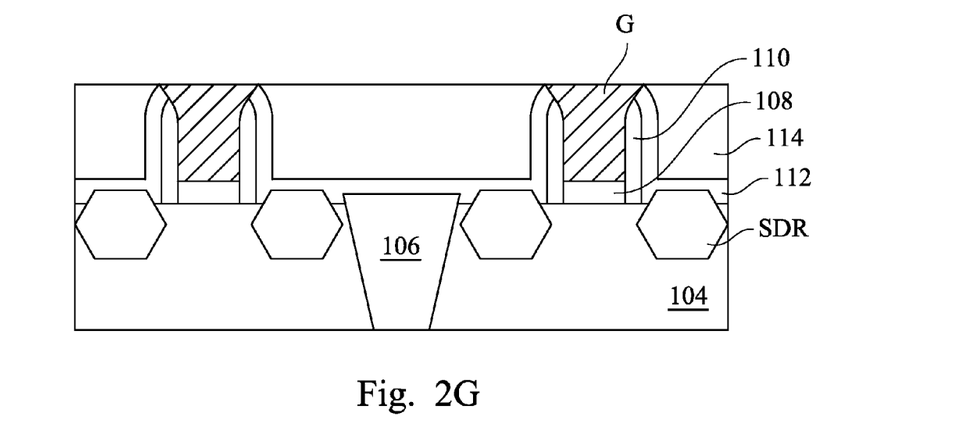

Referring to FIGS. 2F and 2G, a gate G is formed in the cavity C of FIG. 2F. In some embodiments, the gate G is formed using sputtering, PVD, CVD, atomic layer deposition (ALD), any other suitable formation technique or a combination thereof. In some embodiments, the gate G is single-layer structure or multi-layer structure. In some embodiments, the gate G includes titanium (Ti), tantalum (Ta), tungsten (W), aluminum (Al), zirconium (Zr), hafnium (Hf), titanium aluminum (TiAl), tantalum aluminum (TaAl), tungsten aluminum (WAl), zirconium aluminum (ZrAl), hafnium aluminum (HfAl), titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TaAlC), titanium aluminum nitride (TiAlN), tantalum aluminum nitride (TaAlN), any other suitable metal-containing material or a combination thereof.

Figure 2H:
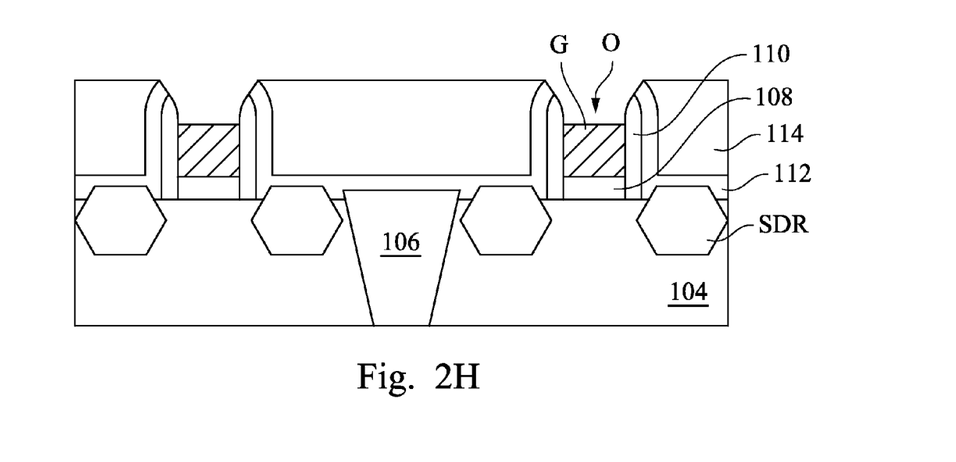

Referring to FIG. 2H, a portion of the gate G is removed to forming an opening O. The portion of the gate G is easily removed due to the cavity C with large top CD. In some embodiments, the portion of the gate G is removed by using an etching process, such as dry, wet etching process or a combination thereof.

Figure 2I:
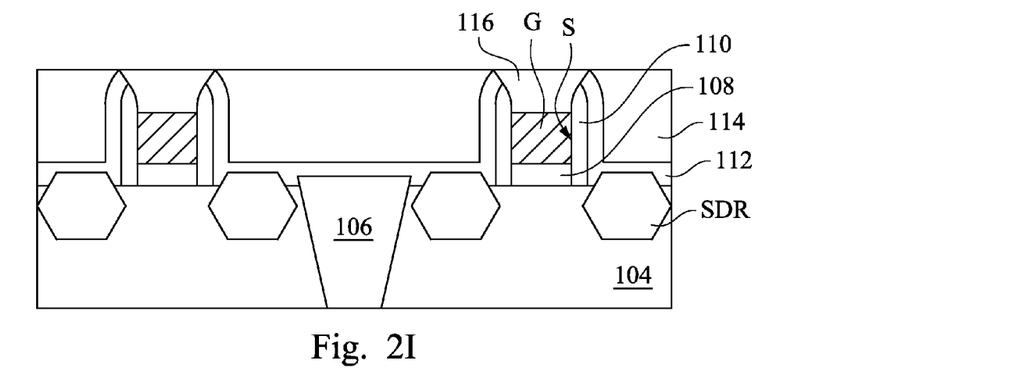

Referring to FIGS. 2H and 2I, a protective layer 116 is formed in the opening O. The protective layer 116 is configured to protect the gate G during subsequent formation of holes, which are configured to respectively accommodate contact plugs for electrically connecting to source-drain regions SDRs. In some embodiments, the protective layer 116 is also called as self-aligned contact (SAC). In some embodiments, the protective layer 116 is formed using deposition, such as PVD or CVD, other suitable processes or a combination thereof. In some embodiments, the protective layer 116 is made of an insulating material, such as silicon oxide, silicon nitride, silicon oxynitride, silicon carbon nitride, any other suitable dielectric material or a combination thereof.

It is noteworthy that, if the surface dopant concentration of the dummy gate DG is equal to the surface dopant concentration of the ILD 114 during the doping process, the contour of the dummy gate DG will be significantly changed before and after the second annealing process is performed.

Figure 3A:
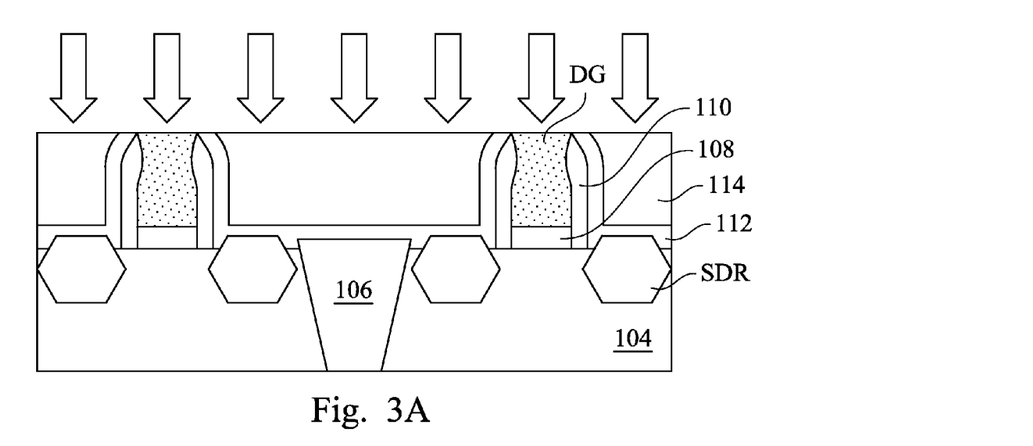
FIG. 3A is a cross-sectional view at a stage subsequent to the stage of FIG. 2D in accordance with some embodiments of the present disclosure.

FIG. 3A is a cross-sectional view at a stage subsequent to the stage of FIG. 2D in accordance with some embodiments of the present disclosure. As shown in FIGS. 2D and 3A, after the first annealing process is performed, a doping process with substantially the same or the same surface dopant concentration is performed on the structure of FIG. 2D, and the second annealing process is then performed. As shown in FIG. 3A, the thermally driven dopant changes the contour of the dummy gate DG of FIG. 2D to form a neck portion due to great compressive stress to the dummy gate DG. The neck portion of the dummy gate DG is not conducive to carry out follow-up processes.

Figure 3B:
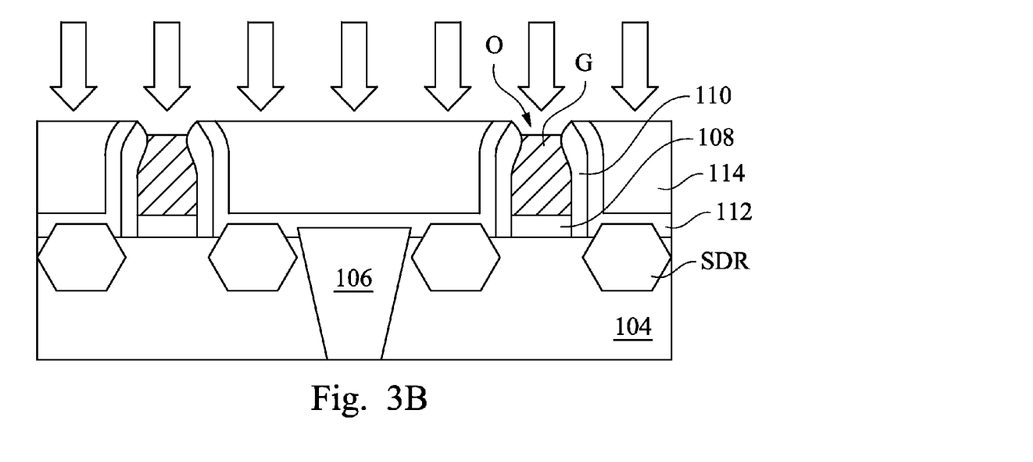
FIG. 3B is a cross-sectional view at a stage subsequent to the stage of FIG. 3A in accordance with some embodiments of the present disclosure.

FIG. 3B is a cross-sectional view at a stage subsequent to the stage of FIG. 3A in accordance with some embodiments of the present disclosure. As shown in FIGS. 3A and 3B, after the second annealing process is performed, the dummy gate DG of FIG. 3A is replace by a gate G, and a portion of the gate G is then removed. However, it is difficult to remove enough thick portion of the G due to the neck portion of the gate G. Therefore, as shown in FIG. 3B, the formed opening O has much smaller depth than that of the opening O of FIG. 2H. The subsequent formed protective layer (not shown) may be too thin and fails to protect the gate G during formation of holes.

The present disclosure also provides a FinFET including the gate with the large top CD. Referring to FIG. 2I, the FinFET includes a fin structure 104, a gate G, a source-drain region SDR and an ILD 114, in which a dopant concentration of the ILD 114 adjacent to the gate G is lower than a dopant concentration of the ILD 114 away from the gate G.

In some embodiments, the fin structure 104 a portion of a substrate (not shown). In some embodiments, the substrate includes an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or a combination thereof. In some embodiments, the substrate is a bulk silicon substrate. In some embodiments, the substrate and the fin structure 104 are made of a same material.

The gate G crosses over the fin structure 104. In some embodiments, the gate G is a single-layer structure or a multi-layer structure. In some embodiments, the gate G includes Ti, Ta, W, Al, Zr, Hf, TiAl, TaAl, WAl, ZrAl, HfAl, TiN, TaN, TiSiN, TaSiN, WSiN, TiC, TaC, TiAlC, TaAlC, TiAlN, TaAlN, any other suitable material or a combination thereof.

The source-drain region SDR is in the fin structure 104. In some embodiments, the source-drain region SDR is an epitaxial structure. In some embodiments, for an n-type FinFET, the source-drain region SDR includes an n-type dopant, such as phosphorus (P), arsenic (As), antimony (Sb), bismuth (Bi), selenium (Se), tellurium (Te), another suitable n-type dopants or a combination thereof. In some embodiments, for an n-type FinFET, the source-drain region SDR includes silicon phosphorous (SiP). In some embodiments, for a p-type FinFET, the source-drain region SDR includes a p-type dopant, such as boron, boron difluoride, or another suitable p-type dopants or a combination thereof. In some embodiments, for a p-type FinFET, the source-drain region SDR includes silicon germanium (SiGe).

The ILD 114 is laterally adjacent to the gate G and includes a dopant, in which a dopant concentration of the ILD 114 adjacent to the gate G is lower than a dopant concentration of the ILD 114 away from the gate G. In some embodiments, a dopant concentration of a portion of the ILD 114 adjacent to the gate G is lower than a dopant concentration of another portion of the ILD 114 with the same depth as the portion of the ILD 114 and away from the gate G. In some embodiments, the dopant is selected from the group consisting of IVA group elements (such as C, Si, Ge, Sn or Pb), VIIIA group elements (such as He, Ne, Ar, Kr, Xe or Rn) and a combination thereof. In some embodiments, the ILD 114 is made of silicon oxide, silicon nitride, silicon oxynitride, silicon carbon nitride, any other suitable dielectric material or a combination thereof.

In some embodiments, the FinFET further includes a dielectric layer 108 between the fin structure 104 and the gate G and served as a gate dielectric layer. In some embodiments, the dielectric layer 108 includes silicon oxide, silicon nitride, silicon oxynitride, silicon carbon nitride, any other suitable dielectric material or a combination thereof.

In some embodiments, the FinFET further includes a CESL 112 over the source-drain region SDR and laterally between the gate G and the ILD 114. In some embodiments, a dopant concentration of the CESL 112 is lower than a dopant concentration of the ILD 114 adjacent to the gate G. In some embodiments, a dopant concentration of a portion of the CESL 112 is lower than a dopant concentration of a portion the ILD 114 with the same depth as the portion of the CESL 112 and adjacent to the gate G. In some embodiments, the CESL 112 is made of silicon oxide, silicon nitride, silicon oxynitride, silicon carbon nitride, any other suitable dielectric material or a combination thereof.

In some embodiments, the FinFET further includes a spacer 110 laterally between the gate G and the CESL 112. In some embodiments, a dopant concentration of the spacer 110 is lower than a dopant concentration of the ILD 114 adjacent to the gate G. In some embodiments, a dopant concentration of a portion of the spacer 110 is lower than a dopant concentration of a portion the ILD 114 with the same depth as the portion of the spacer 110 and adjacent to the gate G. In some embodiments, a dopant concentration of the spacer 110 is lower than or equal to a dopant concentration of the CESL 112. In some embodiments, a dopant concentration of a portion of the spacer 110 is lower than or equal to a dopant concentration of a portion of the CESL 112 with the same depth as the portion of the spacer 110. In some embodiments, the spacer 110 is made of silicon oxide, silicon nitride, silicon oxynitride, silicon carbon nitride, any other suitable dielectric material or a combination thereof.

In some embodiments, a space S confined by the spacer 110 has no neck portion. In some embodiments, each of the layers (not shown) of the multi-layer structure of the gate G is conformally formed along a sidewall of the space S. In some embodiments, the space S confined by the spacer 110 has no upper width smaller than a lower width of the space S.

In some embodiments, the FinFET further includes a protective layer 116 over the gate G. In some embodiments, the protective layer 116 is made of an insulating material, such as silicon oxide, silicon nitride, silicon oxynitride, silicon carbon nitride, any other suitable dielectric material or a combination thereof.

The present disclosure further provides a FinFET including the gate with the large top CD. Referring to FIG. 2I, the FinFET includes a fin structure 104, a gate G, a source-drain region SDR, an ILD 114 and a spacer 110, in which a space S confined by the spacer 110 has no neck portion. Embodiments of the fin structure 104, the gate G, the source-drain region SDR, the ILD 114 and the spacer 110 may be the same as those embodiments exemplified above, and thus are not repeated herein.

In some embodiments, the space S includes an upper portion (not marked) and a lower portion (not marked) beneath the upper portion, and the upper portion has a width increasing away from the fin structure 104. In some embodiments, the ILD 114 and the spacer 110 include a dopant, and a dopant concentration of the spacer 110 is lower than a dopant concentration of the ILD 114. In some embodiments, a dopant concentration of a portion of the spacer 110 is lower than a dopant concentration of a portion of the ILD 114 with same depth as the portion of the spacer 110. In some embodiments, the dopant is selected from the group consisting of IVA group elements (such as C, Si, Ge, Sn or Pb), VIIIA group elements (such as He, Ne, Ar, Kr, Xe or Rn) and a combination thereof.

According to some embodiments, a method of forming a gate includes: forming a dummy gate; forming an ILD laterally adjacent to the dummy gate; doping a dopant into the dummy gate and the ILD, in which a surface dopant concentration of the dummy gate is lower than a surface dopant concentration of the ILD; removing the dummy gate to form a cavity after doping the dopant into the dummy gate and the ILD; and forming the gate in the cavity.

According to some embodiments, a FinFET includes a fin structure, a gate, a source-drain region and an ILD. The gate crosses over the fin structure. The source-drain region is in the fin structure. The ILD is laterally adjacent to the gate and includes a dopant, in which a dopant concentration of the ILD adjacent to the gate is lower than a dopant concentration of the ILD away from the gate.

According to some embodiments, a FinFET includes a fin structure, a gate, a source-drain region, an ILD and a spacer. The gate crosses over the fin structure. The source-drain region is in the fin structure. The ILD is laterally adjacent to the gate and includes a dopant. The spacer is laterally between the gate and the ILD, in which a space confined by the spacer has no neck portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a gate, comprising:
   forming a dummy gate;
   forming an inter layer dielectric (ILD) laterally adjacent to the dummy gate;
   doping a dopant into the dummy gate and the ILD, wherein a surface dopant concentration of the dummy gate is lower than a surface dopant concentration of the ILD;
   removing the dummy gate to form a cavity after doping the dopant into the dummy gate and the ILD; and
   forming the gate in the cavity.

2. The method of claim 1, wherein a surface dopant concentration of the ILD adjacent to the dummy gate is lower than a surface dopant concentration of the ILD away from the dummy gate.

3. The method of claim 1, further comprising performing a first annealing process after forming the ILD laterally adjacent to the dummy gate and before doping the dopant into the dummy gate and the ILD.

4. The method of claim 3, wherein performing the first annealing process comprises performing the first annealing process on the ILD to broaden an upper width of the dummy gate.

5. The method of claim 3, further comprising performing a second annealing process after doping the dopant into the dummy gate and the ILD and before removing the dummy gate.

6. The method of claim 1, further comprising forming a contact etch stop layer (CESL) laterally adjacent to the dummy gate before forming the ILD laterally adjacent to the dummy gate.

7. The method of claim 6, further comprising forming a spacer laterally adjacent to the dummy gate before forming the CESL laterally adjacent to the dummy gate.

8. The method of claim 1, wherein the cavity has no upper widths smaller than a lower width of the cavity.

9. The method of claim 1, wherein the cavity has no neck portion.

10. The method of claim 1, wherein the dopant is selected from the group consisting of IVA group elements, VIIIA group elements, and a combination thereof.

11. The method of claim 1, further comprising:
    removing a portion of the gate to form an opening; and
    forming a protective layer in the opening.

12. The method of claim 7, wherein doping the dopant into the dummy gate and the ILD comprises doping the dopant into the CESL and the spacer, wherein a surface dopant concentration of the spacer is lower than or equal to a surface dopant concentration of the CESL.

13. The method of claim 3, wherein performing the first annealing process is with water vapor.

14. The method of claim 3, wherein performing the first annealing process is at 300 to 800° C.

15. The method of claim 3, wherein performing the first annealing process comprises performing the first annealing process on the ILD to shrink the ILD.

16. The method of claim 1, wherein the surface dopant concentration of the ILD is at least ten times more than the surface dopant concentration of the dummy gate.

17. The method of claim 5, wherein performing the second annealing process is at 500 to 1,300° C.

18. The method of claim 1, further comprising forming a fin structure before forming the dummy gate, wherein forming the dummy gate comprises forming the dummy gate crossing over the fin structure.

19. The method of claim 18, further comprising forming a source-drain region in the fin structure after forming the dummy gate and before forming the ILD laterally adjacent to the dummy gate.

* * * * *